(12) United States Patent
Tsao et al.

(10) Patent No.: US 6,757,196 B1
(45) Date of Patent: Jun. 29, 2004

(54) TWO TRANSISTOR FLASH MEMORY CELL FOR USE IN EEPROM ARRAYS WITH A PROGRAMMABLE LOGIC DEVICE

(75) Inventors: Hsing-Ya Tsao, San Jose, CA (US); Peter W. Lee, Saratoga, CA (US); Fu-Chang Hsu, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 10/016,898

(22) Filed: Dec. 14, 2001

Related U.S. Application Data
(60) Provisional application No. 60/277,852, filed on Mar. 22, 2001.

(51) Int. Cl.[7] .............................................. G11C 16/04
(52) U.S. Cl. ............................ 365/185.17; 365/185.05; 365/185.18; 365/185.24; 365/185.26; 365/85.28; 365/185.29; 365/185.33
(58) Field of Search ....................... 365/185.17, 185.05, 365/185.18, 185.24, 185.26, 185.28, 185.29, 185.33

(56) References Cited
U.S. PATENT DOCUMENTS

| | | | |
|---|---|---|---|
| 5,862,082 A | 1/1999 | Dejenfelt et al. | 365/185.33 |
| 5,904,524 A | 5/1999 | Smolen | 438/264 |
| 5,914,514 A | 6/1999 | Dejenfelt et al. | 257/322 |
| 5,914,902 A | 6/1999 | Sansbury | 365/218 |
| 6,078,521 A | 6/2000 | Madurawe et al. | 365/185.18 |
| 6,108,239 A | 8/2000 | Sekariapuram et al. | 365/185.28 |
| 6,114,724 A * | 9/2000 | Ratnakumar | 257/326 |
| 6,177,315 B1 * | 1/2001 | Bergemont et al. | 438/258 |
| 6,396,745 B1 * | 5/2002 | Hong et al. | 365/185.28 |

* cited by examiner

Primary Examiner—Connie C. Yoha
(74) Attorney, Agent, or Firm—George O. Saile; Stephen B. Ackerman

(57) ABSTRACT

The present invention describes a two transistor flash EEPROM memory cell which has a symmetrical source and drain structure, which permits the cell size not limited by program and erase operations. The memory cell comprises an NMOS floating gate transistor forming a nonvolatile storage device and an NMOS transistor forming an access device. The floating gate transistor is programmed and erased using Fowler-Nordheim channel tunneling. The two transistor memory cell is used in a memory array of columns and rows where a column of cells is coupled by a bit line and a source line, and where a row of cells is coupled by a word line and an access line. The memory array is highly scalable and is targeted for low-voltage, high-speed and high-density programmable logic devices.

39 Claims, 6 Drawing Sheets

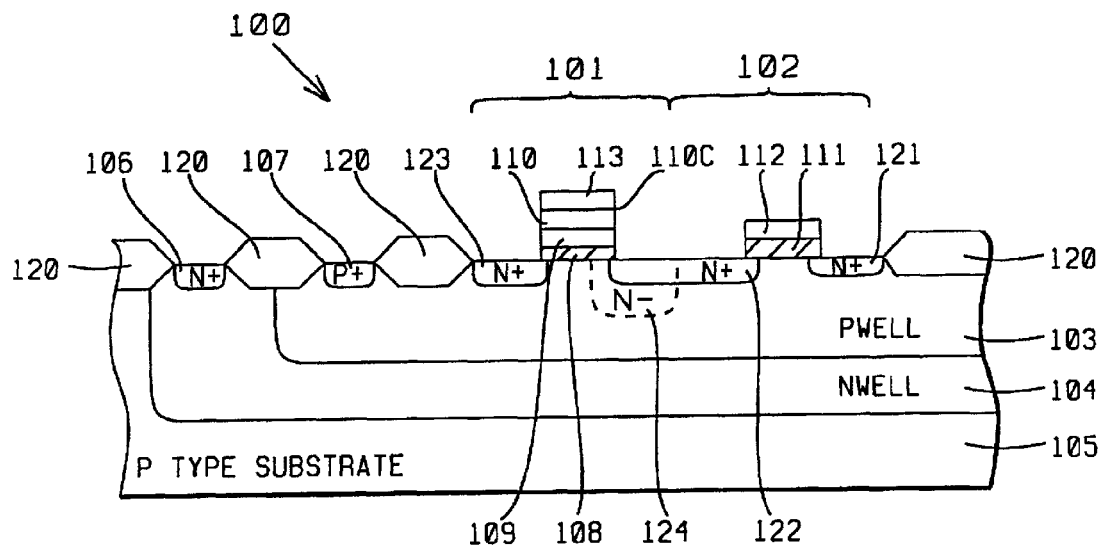
FIG. 1 - Prior Art
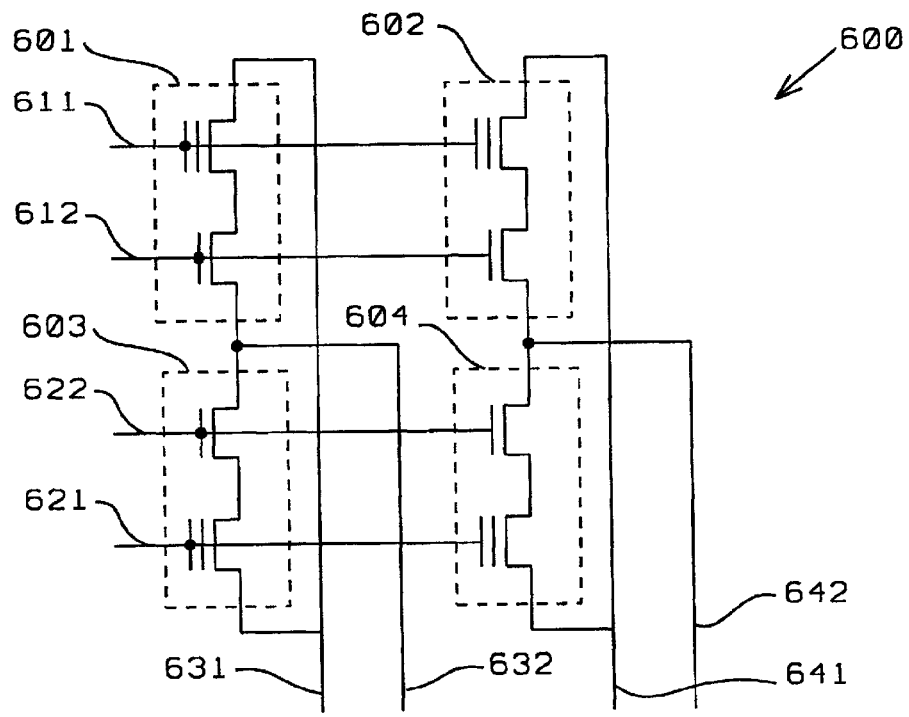
FIG. 2 - Prior Art

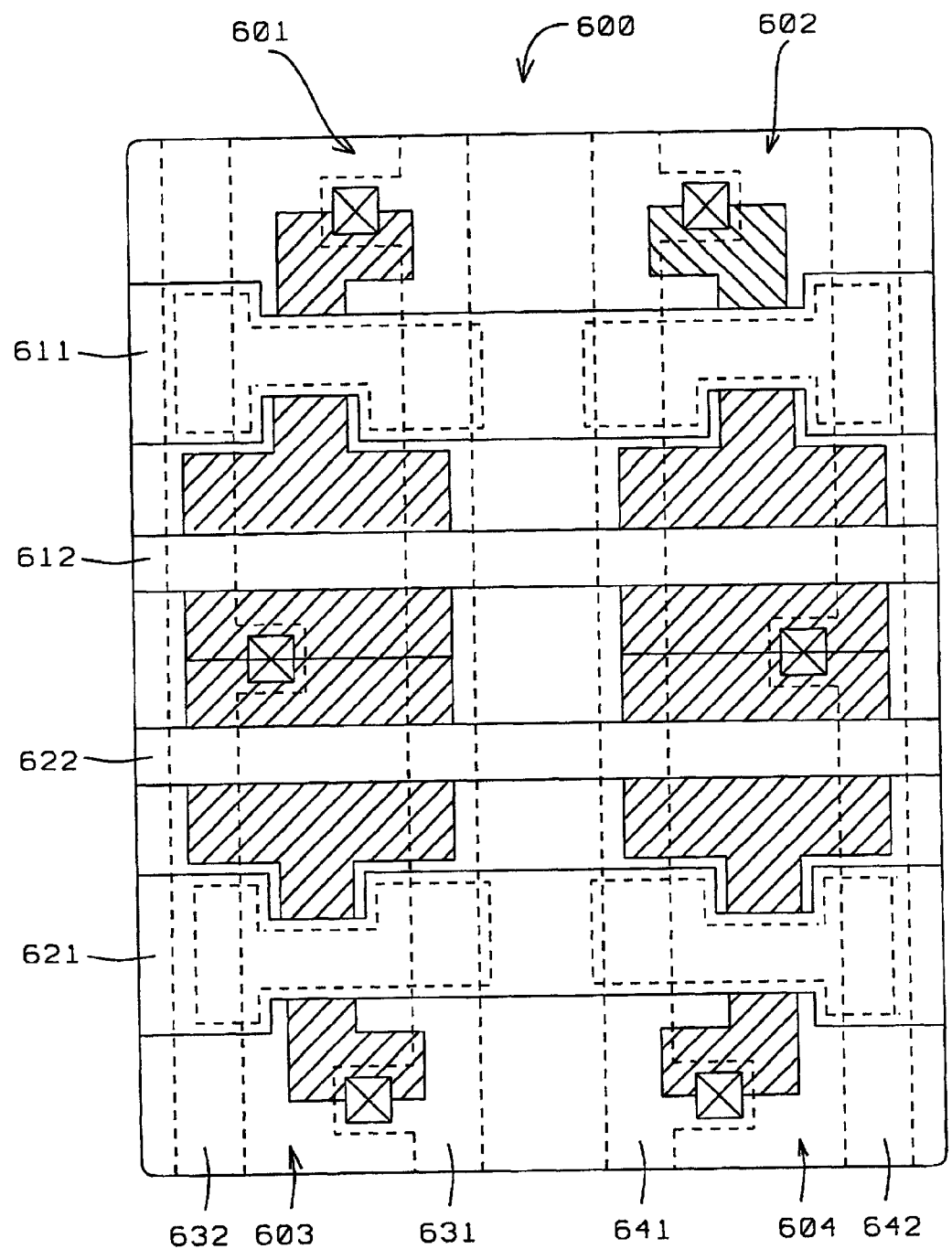
FIG. 3 — Prior Art

| MODE | Selected WL | | Non-Selected WL | | | | |
|---|---|---|---|---|---|---|---|
| | Vcg | Vag | Vcg | Vag | Vs | Vd | Vpwell |
| ERASE | -10 VOLTS | 0 VOLT | — | — | 5 VOLTS | HIGH Z | 5 VOLTS |
| PROGRAM | Vpgm | Vcc | -2.5 VOLTS | Vcc | HIGH Z | -5 VOLTS | -5 VOLTS |
| PROGRAM INHIBIT | Vpgm | Vcc | -2.5 VOLTS | Vcc | HIGH Z | 0 VOLTS | -5 VOLTS |
| READ | Vcc | Vcc | 0 VOLTS | 0 VOLTS | 0 VOLTS | 1 VOLT | 0 VOLTS |

FIG. 8b

| MODE | Selected WL | | Non-Selected WL | | | | |
|---|---|---|---|---|---|---|---|
| | Vcg | Vag | Vcg | Vag | Vs | Vd | Vpsub |
| ERASE | -15 VOLTS | 0 VOLT | — | — | 0 VOLTS | HIGH Z | 0 VOLTS |
| PROGRAM | Vpgm | 8 VOLTS | 2.5 VOLTS | 8 VOLTS | HIGH Z | 0 VOLTS | 0 VOLTS |
| PROGRAM INHIBIT | Vpgm | 8 VOLTS | 2.5 VOLTS | 8 VOLTS | HIGH Z | 5 VOLTS | 0 VOLTS |
| READ | Vcc | Vcc | 0 VOLTS | 0 VOLTS | 0 VOLTS | 1 VOLT | 0 VOLTS |

TWO TRANSISTOR FLASH MEMORY CELL FOR USE IN EEPROM ARRAYS WITH A PROGRAMMABLE LOGIC DEVICE

This application claims benefit of Ser. No. 60/277,852 filed Mar. 22, 2001.

BACKGROUND OF THE INVENTION

1. Field of the Invention

The present invention relates to semiconductor memory and in particular to a two transistor flash EEPROM cell for use in low-voltage, low-power, high-speed, and high-density applications, such as complex programmable logic devices.

2. Description of the Related Art

Prior art Flash memory technology used in applications for devices, such as PLD (programmable Logic Device), PAL (programmable array logic) and EPLD (erasable programmable logic device), are two transistor memory cells comprised of an NMOS nonvolatile memory device and an NMOS access device. These two transistors are connected in series to form the basic flash memory cell for programmable logic devices. The NMOS nonvolatile memory device of prior art is an asymmetric device with respect to the source and drain as well as operating conditions. A high voltage is required across the drain and source region during programming which requires a longer channel gate length to prevent punch through. This causes a physical limitation on how small the cell can be made and in turn limits the use of the cell in ultra high integration levels of the flash memory below 0.18 um technology.

U.S. Pat. No. 6,108,239 (Sekariapuram et al.) is directed toward a compact nonvolatile programmable memory cell which has a substantially transverse or vertical channel relative to the surface of the semiconductor substrate. In U.S. Pat. No. 6,078,521 (Madurawe et al.) a nonvolatile memory cell is directed toward a compact layout and a high logic output voltage. In U.S. Pat. No. 5,914,904 (Sansbury) is directed toward a nonvolatile memory cell that has a read device, a program device and a tunnel diode. In U.S. Pat. No. 5,904,524 (Smolen) a device and method is directed toward an EEPROM device that has a self aligned tunnel window with low gate capacitance and avoids defects caused by field oxide induced stress in the tunnel oxide. In U.S. Pat. No. 5,914,514 (Dejenfelt et al.) a flash EEPROM cell is directed toward a two transistor cell for high speed and high density PLD applications. The storage transistor is directed toward preventing problems with over erase and punch through, and allows scaling the gate length to allow 5V cell programming.

In U.S. Pat. No. 5,862,082 (Dejenfelt et al.) a device is directed toward a flash EEPROM cell that has two transistors with one transistor being a floating gate type device with asymmetric source and drain. In FIG. 1 is shown a cross sectional view of prior art for aflash EEPROM cell 100 similar to that of U.S. Pat. No. 5,862,082. The flash EEPROM cell includes a nonvolatile memory transistor 101 and an access transistor 102. The nonvolatile memory transistor 101 is fabricated within a p-well 103 and is a stack type double poly transistor, which includes a thin tunnel oxide film 108, a floating gate 109, an interpoly dielectric layer 110, a control gate 113, n+ source region 123, n+ source/drain region 122 and n− type region 124. The access transistor 102 is fabricated within a p-well 103, which includes a source/drain region 122, n+ drain region 121, a gate dielectric layer 111 and an access gate 112. The P-well 103 is formed within an n-well 104, which is formed on a p-substrate 105. A field oxide layer 120 is formed over the upper surface of the substrate 105. An N+ type region 106 is formed in the n-well 104 creating a contact region for the N-well. A P+type region 107 is formed in p-well 103 creating a contact region for the P-well.

FIG. 2 of the prior art is a circuit diagram illustrated as a 2×2 array 600, formed by a plurality of identical flash EEPROM cells 601, 602, 603 and 604, which are comprised of the flash EEPROM cell 100. Each column of cells has separate source lines 631 and 641 and drain bit lines 632 and 642 for high-speed PLD applications. Lines 611 and 621 connect to the control gates of the storage transistors of cells 601 and 602, and cells 603 and 604 respectively. Lines 612 and 622 connect to the access gates of the access transistors of cells 601 and 602, and cells 603 and 604 respectively.

FIG.3 is a plane view of prior art of the flash EEPROM cells 601 to 604 of array 600, and corresponding to the circuit diagram in FIG. 2. Control gate lines 611 and 621 run horizontal across the plane view of the cells connecting to the control gates of the storage transistors of cells 601 and 602, and cells 603 and 604 respectively. Similarly access lines 612 and 622 run horizontally across the plane view of the cells connecting to the gates of the access transistors of cells 601 and 602, and cells 603 and 604 respectively. Source lines 631 and 641 run vertically across the plane view connecting to the sources of the storage transistors of the EEPROM cells 601 and 603, and cells 602 and 604 respectively. Similarly bit lines 632 and 642 run vertically across the plane view connecting to the sources of the storage transistors of the EEPROM cells 601 and 603, and cells 602 and 604 respectively.

FIG. 4 is a table for the prior art illustrating the voltage conditions for program, program inhibit, erase and read operation for array 600. Both erase and program operations use the Fowler-Nordheim tunneling. The electrons are injected into the floating gate of the storage transistor of the cells by channel-erase operation which increases the threshold voltage Vt) of the storage transistor. The electrons are extracted out of the floating gate of the storage transistor by an edge-program operation which decreases Vt. The erase operation is performed in a blanket mode. All the cells 601–604 in array 600 are erased simultaneously. A high voltage of 8 to 10 volts is applied to the control gate word lines 611 and 621, and a negative high voltage of −8 to −10 volts is applied to source lines 631 and 641. At the same time, the same negative high voltage −8 to −10 volts is applied to p-well 103, and Vcc supply voltage of 3.3 volts is applied to n-well1 04. Thus the threshold voltage Vt of the storage transistor of the cells is increased for the erase operation.

Continuing to refer to FIG. 4, a program operation is performed bit by bit on each word line. For example, cell 601 is programmed and cell 602 is program inhibited by applying a voltage of −7 to −11 volts to the control gate word line 611 and applying a voltage of 8 volts is to the access gate 612. The source lines 631 and 641 are maintained at a high impedance state, and a voltage of 5 to 8 volts is applied to the bit line 632 with 0 volt applied to the bit line 642. P-well 103 is maintained at 0V and the n-well 104 is maintained at the Vcc supply voltage, 3.3 volts. As a result, cells 601 and 602 are placed in the program and program inhibition mode, respectively.

Continuing to refer to FIG. 4, the two-transistor flash EEPROM cell of prior art created with an n+ source/drain region 122 and an n− type region 124 that are made to be much deeper than the n+ source junction 123, which is surrounded with lightly-doped N-implant to reduce the peak electrical field generated during drain-edge-program operation. For programming purposes, it should be noted that there is a reverse bias voltage between n– type region 124 and p-well 103. As a result of the negative high voltage applied to the gate of the memory cell, electron-hole pairs will be generated and holes are accelerated onto the floating gate under the high electrical field. A certain amount of holes will be trapped in the tunnel oxide, and will degrade the oxide after cycling.

The memory cell of prior art is made non-symmetrical with respect to source and drain junctions in terms of cell structure and operating conditions. A high voltage of more than 5V across lightly doped N implant drain region and source region during program operation is required. Therefore, the prior art cell of FIG. 1 through FIG. 4 needs a longer channel gate length to prevent punch-through. Otherwise, the impact of punch-through is the degraded efficiency in program operation. The prior art has limitations in shrinking the length of the cell for ultra-high integrated flash memory below 0.18 um technology.

SUMMARY OF THE INVENTION

An objective of the present invention is to use a fully symmetrical, scaleable Flash EEPROM memory cell having a storage transistor coupled in series with an access transistor, and which may be used to form compact flash arrays for programmable logic device;

Another objective is to replace the edge-program operations in prior art by channel program operation to remove the high voltage drop across the channel region of the storage transistor of the cell. Such removal of the voltage gradient across source and drain permits the use of a shorter channel length for high-density applications, such as in complex programmable logic devices (CPLDs);

Still another objective of the invention is to provide channel erase by reducing the threshold of flash EEPROM cell with immunity from the over erase problem;

Yet another objective of the invention is to provide a preferred voltage for non-selected word lines for a channel program operation so that the disturbance of the Vt of non-selected cells can be eliminated or substantially reduced;

Yet another further objective of the invention is to provide the preferred voltages for word lines, bit lines, source lines and P-wells so that the aforesaid drawbacks of asymmetrical cell can be eliminated and replaced by a highly scaleable symmetrical cell;

Still another objective of the invention is to provide the preferred voltages for word lines, bit lines, source lines and P-wells so that the aforesaid drawback of channel punch-through can be eliminated and high current program and erase operations can be reduced;

Still another further objective of the invention is to provide the preferred voltages for word lines, bit lines, source lines and P-well so that the aforesaid drawback of low cycling can be improved with high endurance.

Still yet another objective of the invention is to provide a two-transistor cell with over erase immunity for a simplified on chip state machine without program and erase verifications;

Still yet another objective of the invention is to provide a two-transistor cell with a floating gate device fully compatible with the access device and any peripheral NMOS single poly devices in terms of process step and device structure.

The present invention provides a highly scalable, two-transistor, Flash EEPROM cell with a fully symmetrical source and drain structure. The two-transistor cells are comprised of one NMOS floating-gate nonvolatile memory (NVM) and one NMOS access device. These two transistors are connected in series to form a flash cell in accordance with the present invention. A plurality of these two-transistor cells are used to form a matrix array with a plurality of columns and rows. The columns are comprised of metal bit lines and metal source lines coupling to drains and sources of the two-transistor cells. The bit lines and source lines are decoded by a bit line decoder and a source decoder, respectively, and run vertically in parallel through flash cell array. The rows are comprised of a plurality of word lines and access lines. The word lines are connected to the gates of NVM devices of the two-transistor cells, and the access lines are connected to the gates of access devices of two-transistor cells. The word lines and access lines run horizontally across the flash cell array. The bit lines are connected to sense amplifiers and source lines are connected to source line decoders. The word lines and the access lines are driven by X-decoder and access decoders. The preferred two transistor flash cell and the cell array are targeted for low-voltage, high-speed and high-density programmable logic devices, comprising PLD, PAL, and EPLD applications.

Unlike the prior art flash technology used in PLD, PAL and EPLD, the two-transistor flash cell utilizes the preferred Fowler-Nordheim (FN) channel erase and FN channel program methods to allow a fully symmetrical cell structure with ultra-high cell scalability and ultra-low program and erase current. With the two-transistor cell structure, the cell of the present invention provides a solution to fully eliminate the conventional over erase problem that occurs in one transistor flash cells. This is because the access transistor will not conduct current even though the NMOS floating gate nonvolatile memory is over erased. In addition, the flash cell of the present invention can be made to avoid punch through and disturbance problems particularly in sub-micron flash technology by using the preferred channel erase and channel program operations.

The main advantage of the channel erase and the channel program is the elimination of the high voltage drop across the drain and source of the flash cells during program and erase operations. As a result, the channel length of the flash cell is no longer limited by erase and program operations and is only determined by the read operation. Conventionally, read operations in flash memory is designed to operate with less than 1V across the drain and source nodes; therefore, the length of the flash cell of the present invention can be easily shrunken producing a high cell scalability. Also a large read current can be achieved in accordance with the present invention.

The erase and program operations are performed in a manner without any program and erase verifications in a two transistor flash cell. A very simple on-chip state-machine can be accomplished to control the reduced on-chip operations for the applications requiring in-system re-programmability. According to the present invention, the charge storage gate electrode (floating gate electrode) of the nonvolatile cell is formed on the surface of an active region by means of a polysilicon layer on top of a first insulating film. A control gate electrode is formed on the surface of the charge storage gate electrode by means of a polysilicon layer on top of a second insulating film. The bulk of the cell can be either formed on P-substrate or a P-well within a deep N-well on P-substrate.

BRIEF DESCRIPTION OF THE DRAWINGS

This invention will be described with reference to the accompanying drawings, wherein:

FIG. 1 is a cross sectional view of flash EEPROM cell of prior art containing an access device;

FIG. 2 is a circuit diagram of prior art of a 2×2 flash EEPROM cell array;

FIG. 3 is a plan view of a 2×2 flash EEPROM cell array of prior art with two separate metal source lines and two bit lines;

FIG. 4 is a table summarizing the voltages for read, erase, program and program inhibit for a flash EEPROM cell array of prior art;

FIGS. 8a and 8b summarize the preferred bias conditions for read, erase, program and program inhibit modes of a flash EEPROM cell array in accordance with two embodiments of the present invention.

DETAILED DESCRIPTION OF THE PREFERRED EMBODIMENTS

Figure 5:
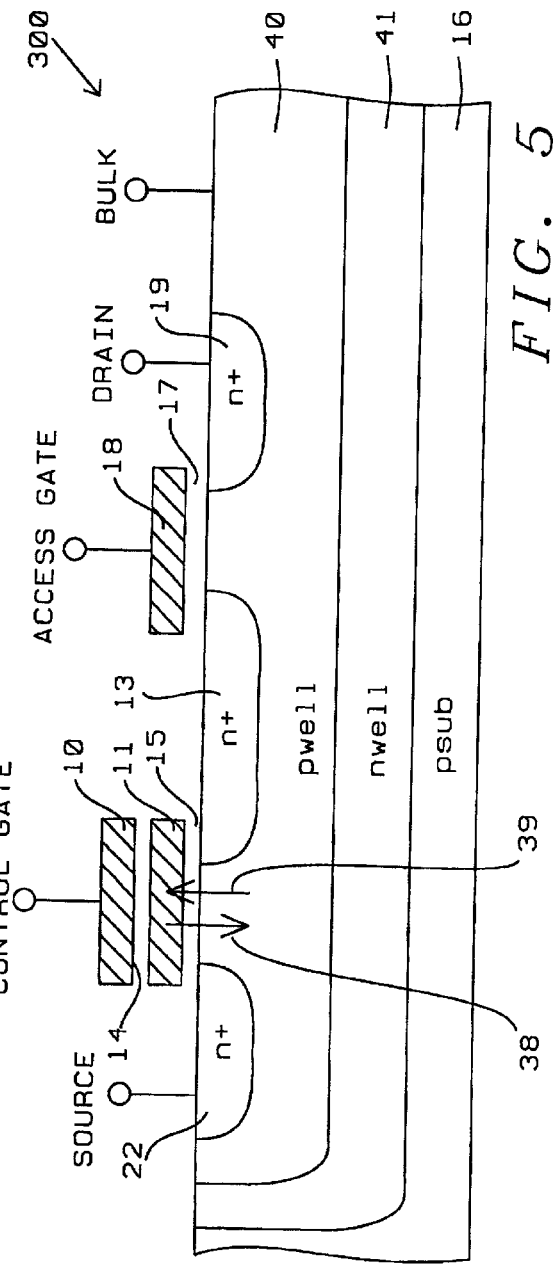
FIG. 5 is a cross sectional view of a two-transistor flash EEPROM cell made on p-well within a deep n-well on p-substrate in accordance with one embodiment of the present invention.

In FIG. 5 is shown a cross sectional view of a two transistor flash EEPROM cell 300 in accordance with one embodiment of this invention. The storage transistor of the EEPROM cell 300 containing a floating gate 11 and a control gate 10 has an n+ source 22 and n+ source/drain 13 that is fully symmetrical on p-well 140. The P-well 40 is formed within a deep n-well 41 on a p-substrate 16. The EEPROM nonvolatile memory storage device is a stack type double poly transistor, which includes a thin tunnel oxide film 15, a floating gate 11, an interpoly dielectric layer 14 and a control gate 10. The flash EEPROM cell 300 of the present invention is preferably programmed and erased by a Fowler-Nordheim (FN) channel erase 38 and FN channel program 39 as indicated by the two arrows. In the prior art, channel erase is used to increase the Vt of cells but an edge-program is used to decrease the Vt of the cells. In the present invention channel erase 38 is used to decrease the Vt of the cells and channel program 39 is used to increase the Vt of the cells.

Continuing to refer to FIG. 5, during a channel program operation, no reverse biased voltage between n+ source/drain region 13 and the p-well 40 occurs, as with an edge-program in the prior art, and there is no voltage drop across the channel region between source and drain. With a positive high voltage being applied between the control gate 10 of the storage transistor and the n+ source/drain region 13, n+ source region 22 and the p-well 40, an electric field with sufficient magnitude and polarity will result in FN tunneling. . Holes are expelled to p-well 40 and electrons are attracted to floating gate 11 No holes will be trapped in the tunnel oxide as with the prior art. As a result, a better endurance for program and erase cycles can be achieved.

Continuing to refer to FIG. 5, since the cell structure of the present invention uses both FN Channel-erase 38 and FN channel-program 39 schemes, the N− region 124 of prior art shown in FIG. 1, which is used for edge-program, is eliminated. Therefore, junctions of drain 13 and source 22 shown in FIG. 5 can be made fully symmetrical allowing a very small channel length. One preferred method of forming a floating gate device comprising the control gate 10 and the access device comprising the access gate is to make both fully process compatible. This can be done by making the tunnel oxide 15 under the floating gate 11 and the gate oxide 17 under the access gate 18 have the same oxide thickness and the same material. Similarly, the thickness of poly floating gate 11 and poly access gate 18 are made to be the same. The source and drain junctions 13, 19 and 22 are made to be the same implant profile and concentration with the same junction depth. The first poly gates 11 and 18 are formed at the same time with the same process step. The second gate 10 is formed after the completion of access gate 18 and floating gate 11. Thus, the flash cell of the present invention uses the preferred channel erase 38 and channel program 39 methods.

Figure 6:
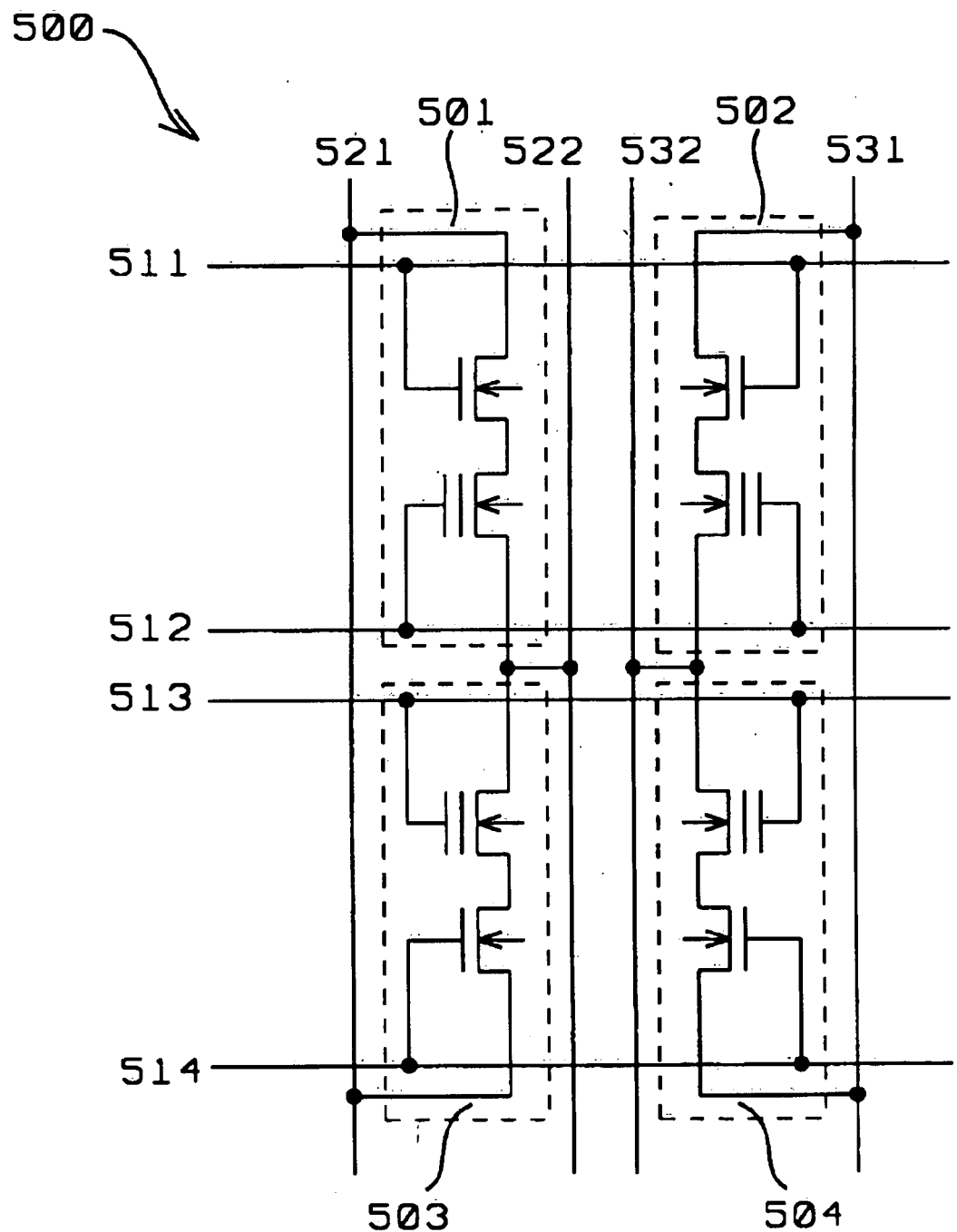
FIG. 6 is a circuit diagram of a 2×2 flash EEPROM cell array in accordance with one embodiment of the present invention.

FIG. 6 is a circuit diagram illustrated as a 2×2 array 500, formed by a plurality of identical two-transistor flash EEPROM cells 501, 502, 503 and 504 as shown in FIG. 5 as cell 300. Each column of cells has separate metal source bit lines 522 and 532, and metal drain bit lines 521 and 531 for high-speed PLD applications. The control gate lines, 512 and 513, are coupled to flash cells 501 to 504. The access-gate lines, 511 and 514, are coupled to single poly cells 501 to 504.

Figure 7:
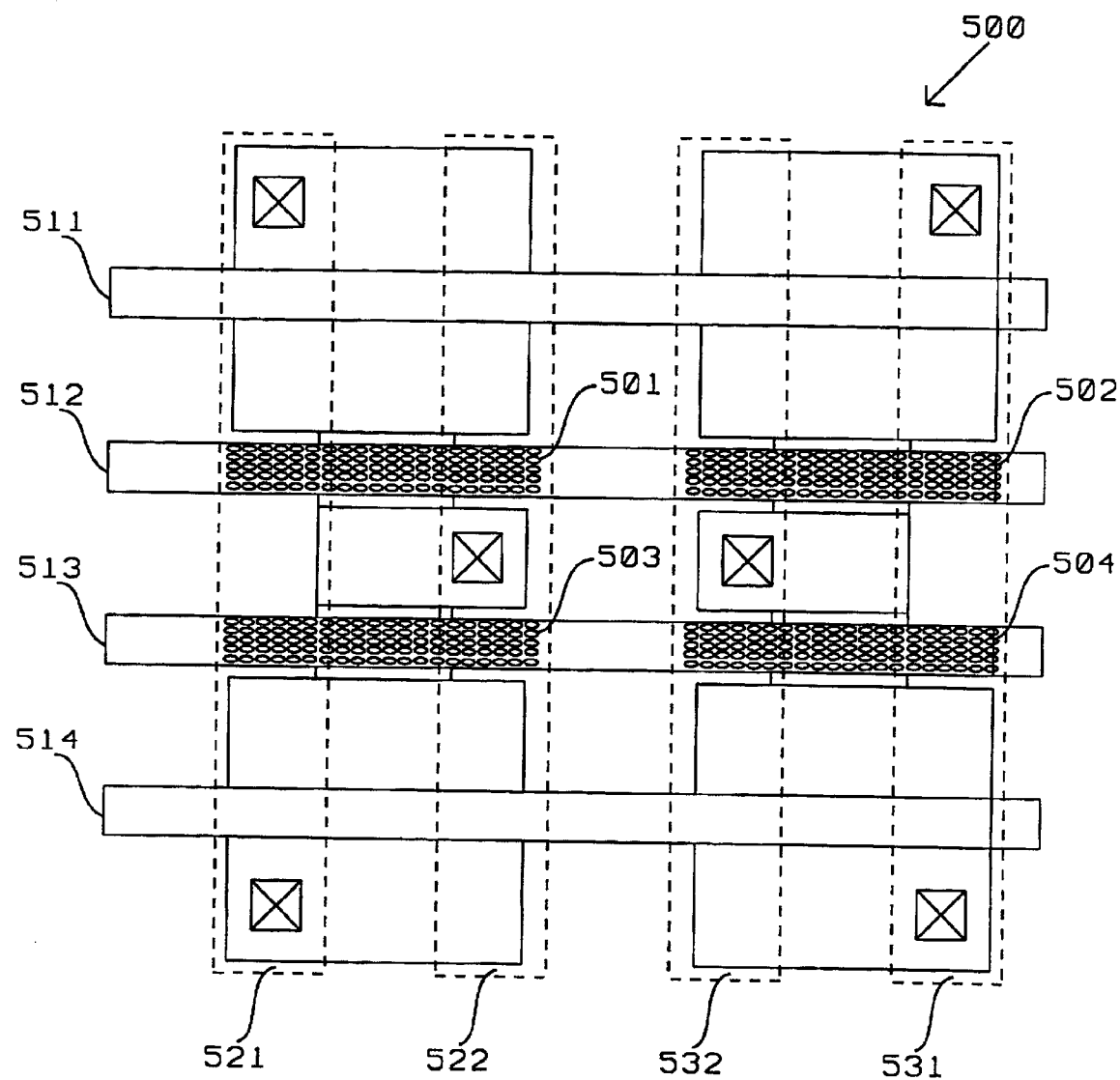
FIG. 7 is a plan view of a flash EEPROM cell array in accordance with one embodiment of the present invention.

FIG.7 is a plan view of a 2×2 cell array 500 comprising flash EEPROM cells 501 to 504, control gate lines 512 and 513, access gate lines 511 and 514, metal drain bit lines 521 and 531, and metal source bit lines of 522 and 532 according to FIG. 6. The control gate of cell 501 (corresponding to control gate 10 in FIG. 5) is connected to the control gate of cell 502 along a horizontal direction, thereby forming a first control gate word line 512. Similarly, the control gate of cell 503 is connected to the control gate of it cell 504 along a horizontal direction, thereby forming a second control gate word line 513. The access gate of cell 501 (corresponding to access gate 18 in FIG. 5) is connected to the access gate of cell 502 along a horizontal direction, thereby forming a first access gate word line 511. Similarly, the access gate of cell 503 is connected to the access gate of cell 504 along a horizontal direction, thereby forming a second access gate word line 514. The source region of the flash EEPROM cells 501 and 503 (corresponding to source region 22 in FIG. 5) are commonly connected by a metal line along the vertical direction, thereby forming a first source bit line 522. The drain region of flash EEPROM cells 501 and 503 (corresponding to drain region 19 in FIG. 5) are connected by a metal line along the vertical direction, thereby forming a first drain bit line 521. In a same manner, the second source bit line 532 is formed by a vertical metal line connecting the source regions of cells 502 and 504, and the second drain bit line 531 is formed by a vertical metal line connecting the drain regions of cells 502 and 504.

Continuing to refer to FIG. 7, it should be noted that field oxide is present in all regions except for those regions defined by drain region 19, source region 22, source/drain region 13 and the channel region of cells 501-504; therefore, the source bit lines 522 and 532 are segmented and each is separately interconnected by metal through contacts. Similarly, the drain bit lines 521 and 531 are segmented and each is separately interconnected by metal through contacts. The channel region of cells 501–504 is formed to be in parallel with the direction of source and drain bit lines.

FIG. 8a shows the preferred bias conditions for control gate word lines, access gate word lines, drain bit lines and source bit lines for the array 500 shown in FIG. 6 and 7 assuming the cell is fabricated in a p-well within a deep n-well on a p-substrate. Voltage conditions for erase, program, program-inhibit and read operations are shown .

Referring to FIG. 8a, an erase operation is performed with all the control gate word lines set at −10V, all of the source bit lines and the p-well at +5V, all of the access gate word lines at 0V and the drain bit lines in high impedance. It should be noted that the −10V and +5V are exemplary values, and the exact value and time of all nodes voltage are subject to different flash technologies. A voltage of −15V across control gate and p-well will result in high electric field in the channel region of a cell. The FN tunneling electric field will attract electrons flowing from floating gate to p-well to decrease Vt of the cell (on-state) after a predetermined erase time. The FN channel erase operation is preferably performed in a blanket mode in a PLD application.

Continuing to refer to FIG. 8a, in the channel program mode, the selected control gate word line is coupled with Vpgm, the access gate word line with Vcc, the drain bit line and p-well with −5V and the source bit lines are in high impedance, performs FN program operation. The non-selected control gate word lines are tied to −2.5V and the non-selected access gate word lines are tied to Vcc to minimize the build-up of disturbance between the gate and the p-well and between the the gate and source/drain. Vpgm is an adjustable voltage input for the control gate of the cells to meet different Vt requirements in program operation. Vpgm may vary from as low as 7V up to about 10V or beyond, and is a ramping voltage that takes 0.5V steps between 7V and 10V. It should be noted that all the voltages are exemplary values for better understanding of present invention. The exact value and time of all nodes in this operation varies with different flash technologies.

Continuing to refer to FIG. 8a, to inhibit programming of selected cells on the selected word line during the program mode, a voltage Vd of 0V is applied to the drain bit line of unselected cells. Compared with the voltage of selected programmed cells, a 5V reduction of the electric field will prohibit the FN tunneling current from occurring in the selected non-programmed cells. As a result, the program inhibited cell will not be selectively programmed during the time of the programming operation.

Continuing to refer to FIG. 8a, to read a cell the drain bit lines are coupled with +1V, the control gate word lines are coupled with Vcc, the access gate word lines are coupled with Vcc, the source bit lines are coupled with 0V and the p-well is coupled with 0V. These voltages are exemplary values to allow better understanding of the present invention. Within a PLD, multiple word lines of memory cells can be simultaneously are coupled with multiple logic inputs.

FIG. 8b shows the preferred bias conditions for control gate word lines, access gate word lines, drain bit lines and source bit lines for the array 500 shown in FIG. 6 and 7 assuming the cell is fabricated on a p-substrate. Voltage conditions for erase, program, program-inhibit and read operations are shown. Referring to FIG. 8b, the speed of the sense amplifier design is required to satisfy two extreme conditions, one memory cell conducting current and all memory cells conducting current. When all the memory cells are conducting, the voltage drop in the selected bit lines can become significant. The time for bit line voltage recovery depends upon the loading of the bit line and cell current. In order to meet high-speed of PLD applications, the two-transistor flash EEPROM cell must have a high transconductance. Shown in FIG. 8b, is a channel erase operation where all word lines are coupled with −15V, all source bit lines and the p-substrate are coupled to 0V and the drain bit lines are in high impedance. The control gate voltage of −15V is an exemplary value. The exact value and time of all nodes voltage are subject to different flash technologies. A voltage of −15V voltage across the gate and p-substrate will result in high electric field in channel region of the cells. The tunneling electric field will attract electrons flowing from floating gate to p-substrate to decrease the Vt (on-state) of the cells after a predetermined erase time. The erase operation will be performed in a blanket mode in the PLD application of the present invention.

Continuing to refer to FIG. 8b, in the channel-program mode the selected control gate word line is coupled to Vpgm, the access gate word line is coupled to 8V, the drain bit line and p-substrate are coupled to 0V, and the source bit lines are in high impedance. The Vpgm is an adjustable voltage input for the control gate of the cells to allow different Vt requirements in the program operation. Vpgm may vary from as low as 12V up to about 15V or beyond, and is a ramping voltage that takes 0.5V steps between 12V and 15V. It should be noted that all the voltages are exemplary values for better understanding the idea of the present invention. The exact value and time of all nodes in program operation are subject to the different requirements of different flash technologies.

Continuing to refer to FIG. 8b, to inhibit programming on the selected cells in the selected word line during the program mode, a drain voltage (Vd) of 5V is applied to the selected drain bit line. The voltage drop across the channel region of the cell is greatly reduced, and the FN program operation is inhibited. The preferred program inhibit conditions reduce the tunneling current in the selected cell by at least two orders of the magnitude as compared with the selected programmed cells. As a result, the Vt changes in the program inhibited cells are negligible during the time of the programming operation. In a read operation the drain bit lines are coupled to +1V, the control gate word lines are coupled to Vcc, the access gate word lines are coupled to Vcc, the source bit lines and the p-substrate node are coupled with 0V. The width of access device is made larger to lower device resistance in order to achieve a high speed read operation.

While the invention has been particularly shown and described with reference to preferred embodiments thereof, it will be understood by those skilled in the art that various changes in form and may be made without departing from the spirit and scope of the invention.

What is claimed is:

1. A two transistor flash memory cell, comprising:
   a) a storage device with a floating gate and a shallow N+ source region,
   b) an access device with a shallow N+ drain region,
   c) said storage device and said access device share a shallow N+ common region that is a drain for the storage device and a source for the access device,
   d) said source, drain and common regions created with a same implant profile, concentration and junction depth and producing a symmetrical memory cell in which size of the memory cell is limited by characteristics of a read operation,
   e) said symmetrical storage cell programmed using a channel program operation, whereby electrons are attracted in said floating gate,
   f) said symmetrical storage cell erase using a channel erase operation, whereby electrons are expelled from said flowing gate.

2. The memory cell of claim 1, wherein the storage device and the access device are NMOS devices.

3. The memory cell of claim 1, wherein the floating gate storage device is coupled in series with the access device to form a cell to create a compact flash array for programmable logic devices.

4. The memory cell of claim 1, wherein said channel erase operation uses Fowler-Nordheim (FN) tunneling to erase said floating gate storage device by removing electrons from said floating gate and said channel program operation uses FN tunneling to program said floating gate storage device by adding electrons to said floating gate.

5. The memory cell of claim 4, wherein the channel erase operation decreases a threshold voltage of said floating gate storage device and the channel program operation increases the threshold voltage of said floating gate storage device.

6. The memory cell of claim 4, wherein a low voltage gradient is produced from source to drain of the storage device during the channel program operation which allows a shorter channel length for high density applications.

7. The memory cell of claim 1, wherein said source region, said drain region and said common region are located in a P-well, within a deep N-well on a P-substrate.

8. The memory cell of claim 1, wherein said source region, said drain region, and said common region are located on a P-substrate.

9. The memory cell of claim 1, wherein a tunnel oxide of said storage deice and a gate oxide of said access device are created within a same process step.

10. The memory cell of claim 1, wherein a floating gate of said storage device and a gate of said access device are formed within a same process step.

11. A flash memory array for use in high density and low voltage applications, comprising:
 a) an array of two transistor flash memory cells, comprising a storage transistor containing a floating gate and an access transistor arranged in rows and columns wherein drains and sources of said storage transistor and said access transistor have a same implant profile, concentration and junction depth,
 b) said cells in a column are coupled by bit lines and source lines,
 c) said bit lines are decoded by a bit line decoder an said source lines are decoded by a source decoder,
 d) said cells in a row are coupled by word lines and access lines,
 e) said word lines are couple to control gates of said storage devices and are controlled by a word line decoder,
 f) said access lines are coupled to gates of said access devices and are controlled by an access decoder,
 g) said storage transistor programmed using a channel program operation, whereby electrons are attracted to said floating gate and holes are expelled to a P-well,
 h) said storage transistor erased using a channel erase operation, whereby electrons are expelled from said floating gate.

12. The flash memory array of claim 11, wherein the two transistor memory cells are arranged such that channels of said storage transistor and said access transistor are oriented vertically.

13. The flash memory array of claim 11, wherein said bit lines are segmented metal lines that couple drains of said access transistors in said column of memory cells, and said source lines are segmented metal lines that couple sources of said storage transistors in said column of memory cells.

14. The flash memory array of claim 11, wherein said erase operation erases a block of memory cells simultaneous using a Fowler-Nordheim tunneling operation to remove electrons from said floating gate of said memory cells and thereby decreasing a threshold voltage of said block of memory cells.

15. The flash memory array of claim 11, wherein said program operation programs memory cells using a Fowler-Nordheim tunneling operation to add electrons to said floating gate of said memory cells and thereby increasing a threshold voltage of said block of memory cells.

16. The flash memory array of claim 11, wherein erase and program operations are performed without any verification.

17. The flash memory array of claim 11, wherein memory cells that are not selected for a memory operation are biased to eliminate disturb conditions.

18. A low voltage high density nonvolatile memory cell, comprising:
 a) a nonvolatile storage means, and an access means,
 b) said nonvolatile storage means and said means made with devices in which sources and drains have a same implant profile, concentration and junction depth,
 c) said storage means coupled to said access means,
 d) said access means providing access to data stored in said storage means,
 e) said storage means using a channel program to attract electron to a floating gate of said storage means and a channel erase to expel electrons from said floating gate.

19. The nonvolatile memory cell of claim 18, wherein the nonvolatile storage means and the access means are couple in series and share an N+ region located in a P-well within a deep N-well on a P-substrate.

20. The nonvolatile memory cell of claim 18, wherein access means provides access to said nonvolatile storage means.

21. The nonvolatile memory cell of claim 18, where said storage means is programmed using Fowler-Nordheim channel tunneling and is erased using Fowler-Nordheim channel tunneling.

22. The nonvolatile memory cell of claim 18, wherein the storage means and the access means are produced using a same process.

23. A nonvolatile memory array, comprising:
 a) a memory cell means comprising a nonvolatile storage means and an access means, wherein drains and sources of said nonvolatile storage means and said access means have a same implant profile, concentration and junction depth,
 b) a memory array means configured with rows and columns of said memory cell means,
 c) a column of cells of said memory array means coupled to access means of said column of cells by a bit line means and coupled to nonvolatile storage means of said column of cells by a source line means,
 d) a row of cells of said memory array means coupled to access means of said row of sells by an access line means and coupled to nonvolatile storage means of said row of cells by a word line means,
 e) said memory array means erased by expelling electrons from a floating gate of said nonvolatile storage means,
 f) said memory means programmed by attracting electrons to said floating gate and thereby raising a threshold voltage of said nonvolatile storage means.

24. The nonvolatile memory of claim 23, wherein said nonvolatile storage means and said access means are coupled by an N+ implantation means located in a P-well with a deep N-well on a P-substrate.

25. The nonvolatile memory of claim 23, wherein sad nonvolatile storage means and said access means are coupled by an N+ implantation means located on P-substrate.

26. The nonvolatile memory of claim 23, wherein said bit line means is formed by segmented means of metal lines.

27. The nonvolatile memory of claim 23, wherein said source line means is formed by segmented means of metal lines.

28. The nonvolatile memory of claim 23, wherein said bit line means is controlled by a bit line decoder means.

29. The nonvolatile memory of claim 23, wherein said source line means is controlled by a source line decoder means.

30. The nonvolatile memory of claim 23, wherein said access line means is controlled by an access line decoder means.

31. The nonvolatile memory of claim 23, wherein said word line means is controlled by a word line decoder means.

32. The nonvolatile memory of claim 23, wherein said cells are programmed using Fowler-Nordheim channel tunneling means, and said cells are erased using Fowler-Nordheim channel tunneling means.

33. A method for creating a nonvolatile memory for a low voltage and high performance applications, comprising:
   a) forming an array of nonvolatile memory cells, wherein each cell comprises a nonvolatile storage device and an access device, wherein drains and sources of the nonvolatile storage device and the access device are made to be the same implant profile and impurity concentration with the same junction depth,
   b) coupling said memory cells in a column of said array to bit lines and to source lines,
   c) coupling said memory cells in a row of said array to word lines and access lines,
   d) selecting said memory cells with sad bit lines and said source lines,
   e) accessing said memory cells with said word lines and said access lines,
   f) programming said memory cells by attracting electrons from a channel to a floating gate of said nonvolatile storage device,
   g) erasing said memory cells by expelling electrons from said floating gate to said channel.

34. The method of claim 33, wherein said memory device and said access device are coupled by an implanted N+ region in a P-well within an N-well on a P-substrate.

35. The method of claim 33, wherein said memory device and said access device are coupled by an implanted N+ region on a P-substrate.

36. The method of claim 33, wherein said cells in a column are coupled to said bit line through a drain of said access devices of each cell in the column.

37. The method of claim 33, wherein said cells in a column are coupled to said source line through a source of said storage device of each cell in the column.

38. The method of claim 33, wherein said cells in a row are coupled to said access line through a gate of said access device of each cell the row.

39. The method of claim 33, wherein said cells in a row are coupled to said word line through a control gate of said access device of each cell in the row.

* * * * *